US012599015B2

(12) United States Patent
Park et al.

(10) Patent No.: US 12,599,015 B2
(45) Date of Patent: Apr. 7, 2026

(54) POWER MODULE FOR VEHICLE

(71) Applicants: Hyundai Motor Company, Seoul (KR); Kia Corporation, Seoul (KR)

(72) Inventors: Jun Hee Park, Hwaseong-Si (KR); Sung Taek Hwang, Seoul (KR); Nam Sik Kong, Hwaseong-Si (KR); Myung Ill You, Gwangju (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 426 days.

(21) Appl. No.: 18/137,595

(22) Filed: Apr. 21, 2023

(65) Prior Publication Data

US 2024/0088009 A1     Mar. 14, 2024

(30) Foreign Application Priority Data

Sep. 14, 2022    (KR) ......................... 10-2022-0115699

(51) Int. Cl.
   *H01L 23/498*       (2006.01)
   *H10W 70/05*        (2026.01)
   (Continued)

(52) U.S. Cl.
   CPC ......... *H10W 70/65* (2026.01); *H10W 70/098* (2026.01); *H10W 90/401* (2026.01);
   (Continued)

(58) Field of Classification Search
   CPC ........... H01L 23/49838; H01L 21/4867; H01L 23/49833; H01L 23/3735; H01L 24/16;

H01L 24/32; H01L 24/33; H01L 24/73;
H01L 2224/16238; H01L 2224/32238;
H01L 2224/33181; H01L 2224/73203;
H01L 2224/73253; H01L 23/4334;
(Continued)

(56) References Cited

U.S. PATENT DOCUMENTS

| 7,547,966 | B2 | 6/2009 | Funakoshi et al. |
| 11,011,443 | B2 | 5/2021 | Suwa et al. |

(Continued)

FOREIGN PATENT DOCUMENTS

| KR | 10-2008278 | 8/2010 |
| KR | 10-2013-0069108 | 6/2013 |

(Continued)

*Primary Examiner* — Fernando L Toledo
*Assistant Examiner* — Shawn Shaw Muslim
(74) *Attorney, Agent, or Firm* — MORGAN, LEWIS & BOCKIUS LLP

(57) ABSTRACT

A power module for a vehicle, includes: a first substrate including a first metal circuit disposed on a 1-1st surface, and a first spacer extending from the first metal circuit in a first direction; a second substrate spaced from and facing the first substrate in a second direction, and including a second metal circuit disposed on a 2-1st surface facing the 1-1st surface, and a second spacer extending from the second metal circuit in the second direction; and a semiconductor chip disposed between the first substrate and the second substrate and including a power pad and a signal pad, the first spacer and the second spacer extending toward each other, and the second spacer including a 2-1st spacer connected to the power pad and a 2-2nd spacer connected to the signal pad.

17 Claims, 9 Drawing Sheets

(51) Int. Cl.

| | |
|---|---|
| *H10W 70/65* | (2026.01) |
| *H10W 90/00* | (2026.01) |
| *H10W 40/25* | (2026.01) |
| *H10W 72/00* | (2026.01) |
| *H10W 72/30* | (2026.01) |

(52) U.S. Cl.

CPC .... *H10W 40/255* (2026.01); *H10W 72/07354* (2026.01); *H10W 72/347* (2026.01); *H10W 72/856* (2026.01); *H10W 72/877* (2026.01); *H10W 90/724* (2026.01); *H10W 90/734* (2026.01)

(58) Field of Classification Search

CPC ......... H01L 23/49541; H01L 23/49811; H01L 24/29; H01L 23/5385; H01L 24/83; H01L 23/49565; H01L 21/4875; H01L 21/4882; H01L 21/4889; H01L 23/3672; H01L 23/49575; H01L 23/367; H01L 23/49844

See application file for complete search history.

(56) References Cited

U.S. PATENT DOCUMENTS

| | | | | |
|---|---|---|---|---|
| 2012/0222669 A1* | 9/2012 | Sellier | ................... | F24S 10/753 |
| | | | | 126/712 |
| 2013/0001199 A1* | 1/2013 | Takahashi | .............. | H05K 3/386 |
| | | | | 427/226 |
| 2020/0091124 A1* | 3/2020 | Liao | ......................... | G02B 6/43 |
| 2020/0266130 A1* | 8/2020 | Kawashima | ...... | H01L 23/49838 |
| 2024/0105573 A1* | 3/2024 | Park | ........................ | H01L 24/83 |

FOREIGN PATENT DOCUMENTS

| | | |
|---|---|---|
| KR | 10-2017-0071142 | 6/2017 |
| KR | 10-2018-0030298 | 3/2018 |
| KR | 10-2018-0069231 | 6/2018 |
| KR | 10-2048478 | 11/2019 |
| KR | 10-2020-0129699 | 11/2020 |
| KR | 10-2024-0042844 | 4/2024 |

* cited by examiner

FIG. 7

POWER MODULE FOR VEHICLE

CROSS REFERENCE TO RELATED APPLICATION

The present application claims priority to Korean Patent Application No. 10-2022-0115699, filed Sep. 14, 2022, the entire contents of which is incorporated herein for all purposes by this reference.

BACKGROUND OF THE PRESENT DISCLOSURE

Field of the Present Disclosure

The present disclosure relates to a power module for a vehicle, and particularly to a power module for a vehicle, which is mounted to an inverter for operating a driving motor provided in an electric vehicle.

Description of Related Art

As one among the key components of hybrid electric vehicles and electric vehicles, there is a power converter (for example, an inverter). The power converter is a major component of an eco-friendly vehicle, and many technologies for the power converter have been developed. The key technology in the field of eco-friendly vehicles is to develop a power module which is a core portion of the power converter and accounts for the highest costs.

Among such power modules, there is a double-sided cooling power module in which two surfaces corresponding to different substrates and facing each other are cooled individually. The double-sided cooling power module employs a via spacer to connect the different substrates and secure a space between the different substrates, and it is important where to place the via spacer due to its function of electric conduction. Furthermore, it is important to secure the durability of the via spacer.

Furthermore, a semiconductor chip is disposed between the different substrates, and a process for bonding a wire to the semiconductor is added to receive a control signal for the semiconductor chip from the outside.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a double-sided cooling power module that can conduct electricity and maintain a space between metal circuits of substrates without a separate spacer.

According to an exemplary embodiment of the present disclosure, there is provided A power module for a vehicle, including: a first substrate including a first metal circuit disposed on a 1-1st surface, and a first spacer extending from the first metal circuit in a first direction; a second substrate spaced from and facing the first substrate in a second direction, and including a second metal circuit disposed on a 2-1st surface facing the 1-1st surface, and a second spacer extending from the second metal circuit in the second direction; and a semiconductor chip disposed between the first substrate and the second substrate and including a power pad and a signal pad, wherein the first spacer and the second spacer are extended toward each other, and the second spacer includes a 2-1st spacer connected to the power pad and a 2-2nd spacer connected to the signal pad.

The power module may further include a signal lead disposed between the first metal circuit and the second metal circuit, wherein the signal lead is electrically connected to the signal pad via the second metal circuit and the 2-2nd spacer.

The 2-2nd spacer may have a cross-sectional area that becomes smaller in a direction extending from the second metal circuit.

The cross-sectional area of the 2-2nd spacer at an end portion in a direction extending from the second metal circuit may be smaller by a preset percentage than the cross-sectional area at a side of the second metal circuit.

The preset percentage is greater than or equal to 30%.

The 2-2 nd spacer may be formed having a shape of a truncated cone or a truncated polygonal pyramid, the cross-sectional area of which becomes smaller in a direction extending from the second metal circuit.

The first spacer and the second spacer may contain glass frit in internal portions thereof except end portions thereof.

A cooling layer connected to a cooler may be disposed on each of a 1-2nd surface opposite to the 1-1st surface of the first substrate and a 2-2nd surface opposite to the 2-1st surface of the second substrate.

The power module may further include a power lead disposed between the first metal circuit and the second metal circuit, and the power lead may be electrically connected to the power pad via the second metal circuit and the 2-2nd spacer.

The first substrate includes a first cooling layer provided on the 1-2nd surface opposite to the 1-1st surface and connected to a cooling channel, and the second substrate includes a second cooling layer provided on the 2-2nd surface opposite to the 2-1st surface and connected to the cooling channel.

The spacer may be extended from the metal circuit by printing and curing a conductive paste through a screen or by curing a conductive molten material.

When the spacer is prepared using a screen, a deformed portion of a conductive paste stretched in the direction of releasing the screen in a screen releasing process may be post-processed by a pressing process or a grinding process.

According to an exemplary embodiment of the present disclosure, there is provided a method of manufacturing a power module, including: forming a metal circuit on a first surface of an insulating layer; and forming a plurality of spacers extending from the metal circuit in a certain direction, the forming of the plurality of spacers including: printing a conductive paste; and curing the printed conductive paste, and wherein the printing and the curing are repeated predetermined times.

The printing may include: seating a screen formed with a pattern; applying the conductive paste to the pattern; releasing the screen; and removing a deformed portion of the applied conductive paste stretched as the screen is released.

The method may further include forming a cooling layer on a second surface opposite to the first surface of the insulating layer.

The method may further include plating the metal circuit and the plurality of spacers.

According to an exemplary embodiment of the present disclosure, the different spacers integrally formed respectively extending from the metal circuits of the different substrates toward each other are used in connecting the substrates, and therefore the substrates are connected without adding the separate spacer or the like portions, simplifying the process and reducing manufacturing costs due to decrease in the number of portions.

Furthermore, the spacer is formed integrally and not separated, and it is thus possible to accurately control the position of the spacer.

Furthermore, the substrate and the spacer are formed as a single body, and therefore the tolerance for the error of the single body required to be compensated by soldering becomes narrower than those for individual thickness errors of the substrate and the spacer in the case of using the separate spacer.

Furthermore, when the spacer is formed by stacking copper pastes, the spacer exhibits higher heat dissipation performance due to the thermal conductivity of copper, improving thermal characteristics.

Furthermore, the signal lead is connected to the metal circuit, and the spacer extending from the metal circuit is connected to the signal pad of the semiconductor chip, so that the conventional wire bonding for connecting the signal pad and the signal lead may be excluded, simplifying a manufacturing process and reducing manufacturing costs due to decrease in the number of portions.

Furthermore, the distance between the substrates is shorted by excluding the wire bonding, and therefore the length of the spacer is minimized, causing difficulty to be decreased in a process of assembling the substrates and improving heat dissipation performance due to the shortened distance between the substrates.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

FIG. 7 is a cross-sectional view showing thermal variation in a conventional power module for a vehicle and thermal variation in a power module according to an exemplary embodiment of the present disclosure.

Figure 1:
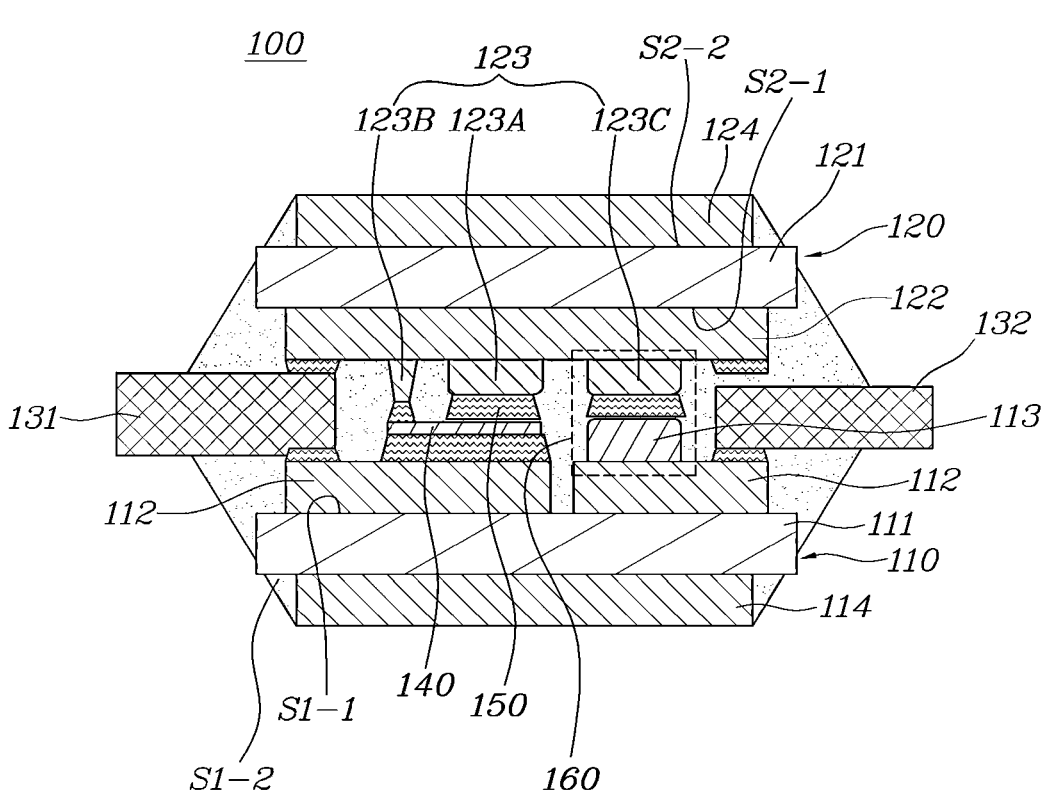
FIG. 1 is a cross-sectional view of a power module for a vehicle according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Regarding embodiments of the present disclosure included in the present specification or application, the specific structural or functional description is merely illustrative for describing the exemplary embodiments of the present disclosure, and embodiments of the present disclosure may be implemented in various forms but not be construed as being limited to the exemplary embodiments set forth in the present specification or application.

Because the exemplary embodiments of the present disclosure may be variously modified and have various forms, specific exemplary embodiments will be illustrated in the drawings and described in detail in the present specification or application. However, it may be understood that embodiments of the present disclosure are intended not to be limited to the specific embodiments but to cover all modifications, equivalents or alternatives without departing from the spirit and technical scope of the present disclosure.

Terms such as "first" and/or "second" are used herein merely to describe a variety of elements, but the elements are not limited by these terms. Such terms are used only for distinguishing one element from another element. For example, without departing from the conceptual scope of the present disclosure, a first element may be referred to as a second, and vice versa.

When a certain element is referred to as being "connected to" or "coupled to" another element, it will be understood that they may be directly connected to or coupled to each other but or intervening elements may be present therebetween. On the other hand, when a certain element is referred to as being "directly connected to" or "directly coupled to" another element, it will be understood that no intervening elements are present therebetween. Other expressions describing relationships between elements, such as "between," "immediately between," "adjacent to," "directly adjacent to," or etc. may also be construed in the same manner.

Terms used in the present specification are merely used for explaining specific embodiments, but not intended to limit the present disclosure. Unless the context clearly dictates otherwise, singular forms include plural forms as well. It is to be understood that terms "include," "have," etc. As used herein specify the presence of stated features, integers, steps, operations, elements, components, or combination thereof, but do not preclude the presence or addition of one or more other features, integers, steps, operations, elements, components or combination thereof.

Unless defined otherwise, all terms used herein including technical or scientific terms have the same meanings as those generally understood by a person having ordinary knowledge in the art to which the present disclosure pertains. The terms such as those defined in generally used dictionaries are construed to have meanings matching that in the context of related technology, and unless clearly defined otherwise, are not construed to be ideally or excessively formal.

Below, the present disclosure will be described in detail by describing embodiments with reference to the accompanying drawings. Like reference numerals in the drawings refer to like numerals.

A double-sided cooling power module requires an electrical connection between an upper substrate and a lower substrate for circuit configuration. To the present end, a via spacer provided separately from the upper and lower substrates may be used. Furthermore, the circuit configuration of the power module and the arrangement of other parts are generally varied depending on the positions of the via spacer. Furthermore, the size of the via spacer needs to be large to conduct a high current according to the characteristics of the power module using high power, and therefore there is a limit to reducing the size of the via spacer.

Meanwhile, a double-sided cooling power module 100 generates a lot of heat during operation due to the structure of semiconductor chips 140 disposed inside the power module 100. Furthermore, when neighboring semiconductor chips 140 generate heat simultaneously during the operation of the power module 100, thermal overlap effects between the semiconductor chips 140 cause the power module 100 to additionally increase in temperature. The spacer is generally bonded by a bonding material to maintain the electrical connection between the upper substrate and the lower substrate, and a metal layer applied to the semiconductor chips 140 is consumed while reacting with the bonding material due to the thermal overlap effects or the like heat, decreasing the durability (or lifespan) or deteriorating electrical characteristics.

Meanwhile, the double-sided cooling power module generates a lot of heat during operation due to the structure of internal chips disposed inside the power module. Furthermore, when neighboring chips generate heat simultaneously during the operation of the power module, thermal overlap effects between the chips cause the power module to additionally increase in temperature. The spacer is generally bonded by a bonding material to maintain the electrical connection between the upper substrate and the lower substrate, and a metal layer applied to a semiconductor chip is consumed while reacting with the bonding material due to the thermal overlap effects or the like heat, decreasing the durability (or life) or deteriorating electrical characteristics. Furthermore, the via spacer may be tilted by external shock or vibration while the liquid bonding material is solidified, and thus causes a problem that the upper substrate and the lower substrate are not normally connected.

Furthermore, the semiconductor chip disposed between the upper substrate and the lower substrate receives a control signal from the outside. To present end, a wire for transmitting the control signal to the semiconductor chip is needed, and a process of bonding the wire to the semiconductor chip is added. For the present wire bonding, the thickness of the via spacer has been required to be set in consideration of the height of the wire bonding, and the thickness of the via spacer causes difficulty in assembling parts to increase in a process of assembling the upper substrate and the lower substrate.

According to an exemplary embodiment of the present disclosure, there are provided a via spacer formed integrally with the substrate, and a signal spacer formed integrally with the substrate and connected to the semiconductor chip, instead of the foregoing separate via spacer.

Figure 2:
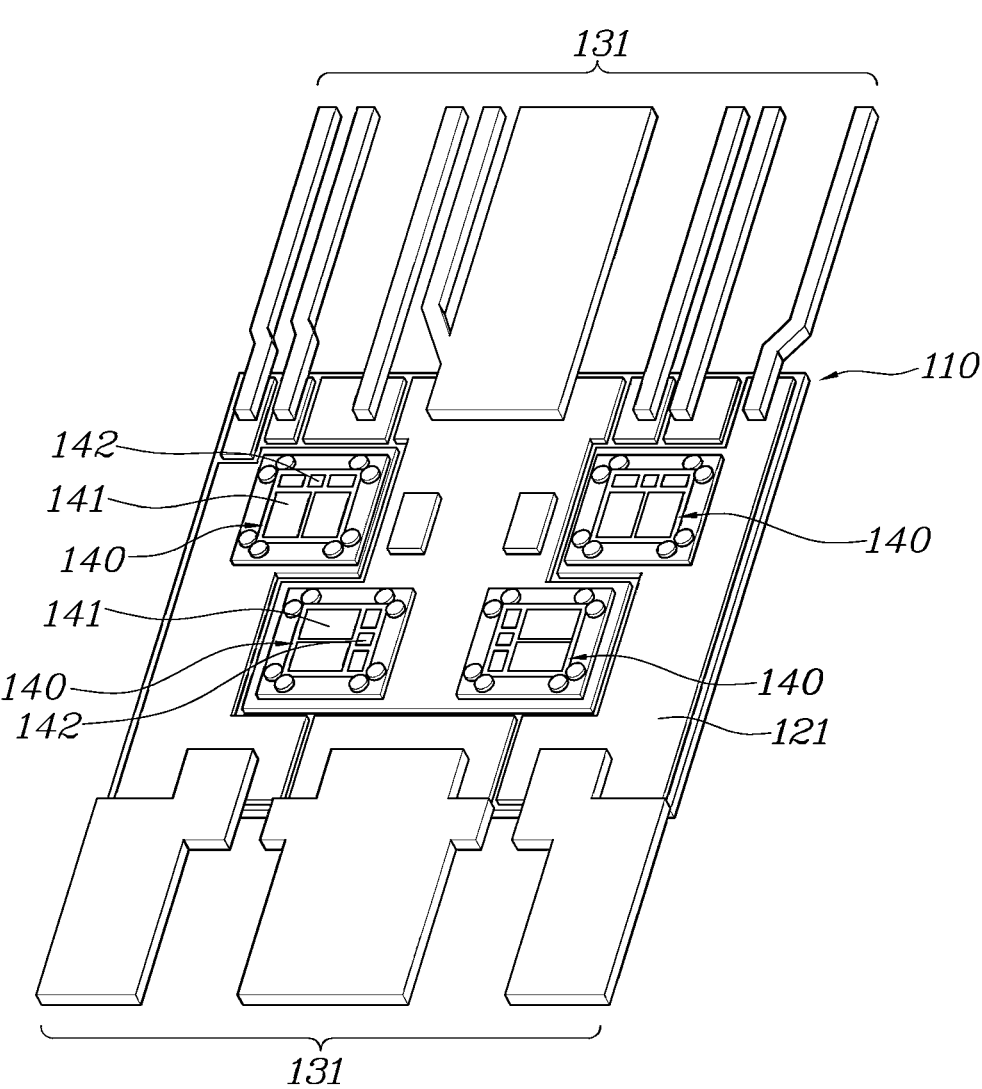
FIG. 2 is a perspective view of a first substrate provided in a power module for a vehicle according to an exemplary embodiment of the present disclosure.
Figure 3:
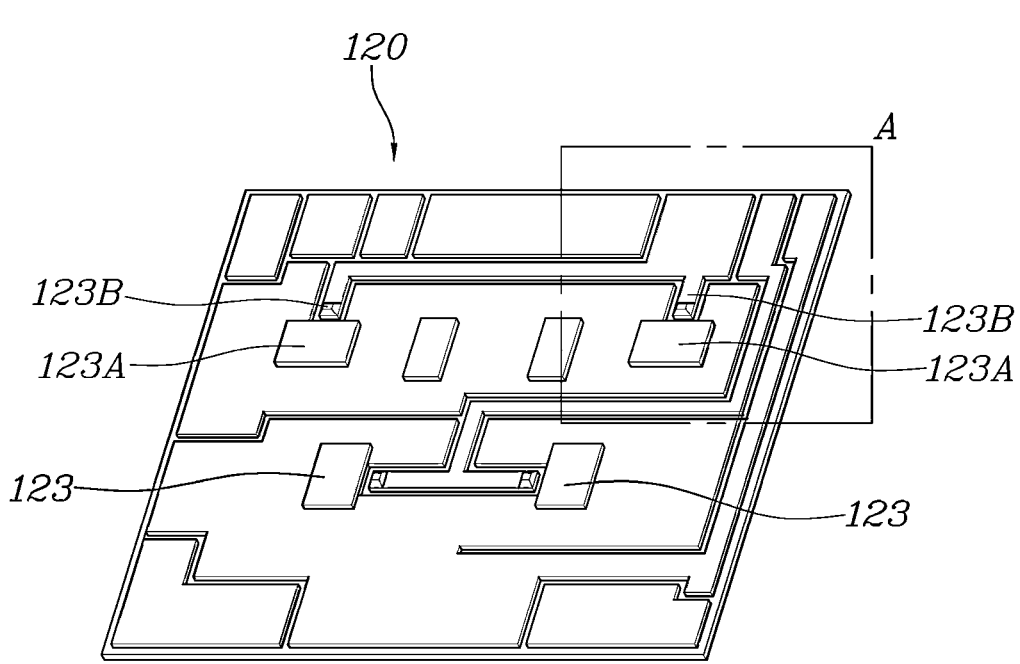
FIG. 3 is a perspective view of a second substrate provided in a power module for a vehicle according to an exemplary embodiment of the present disclosure.
Figure 4:
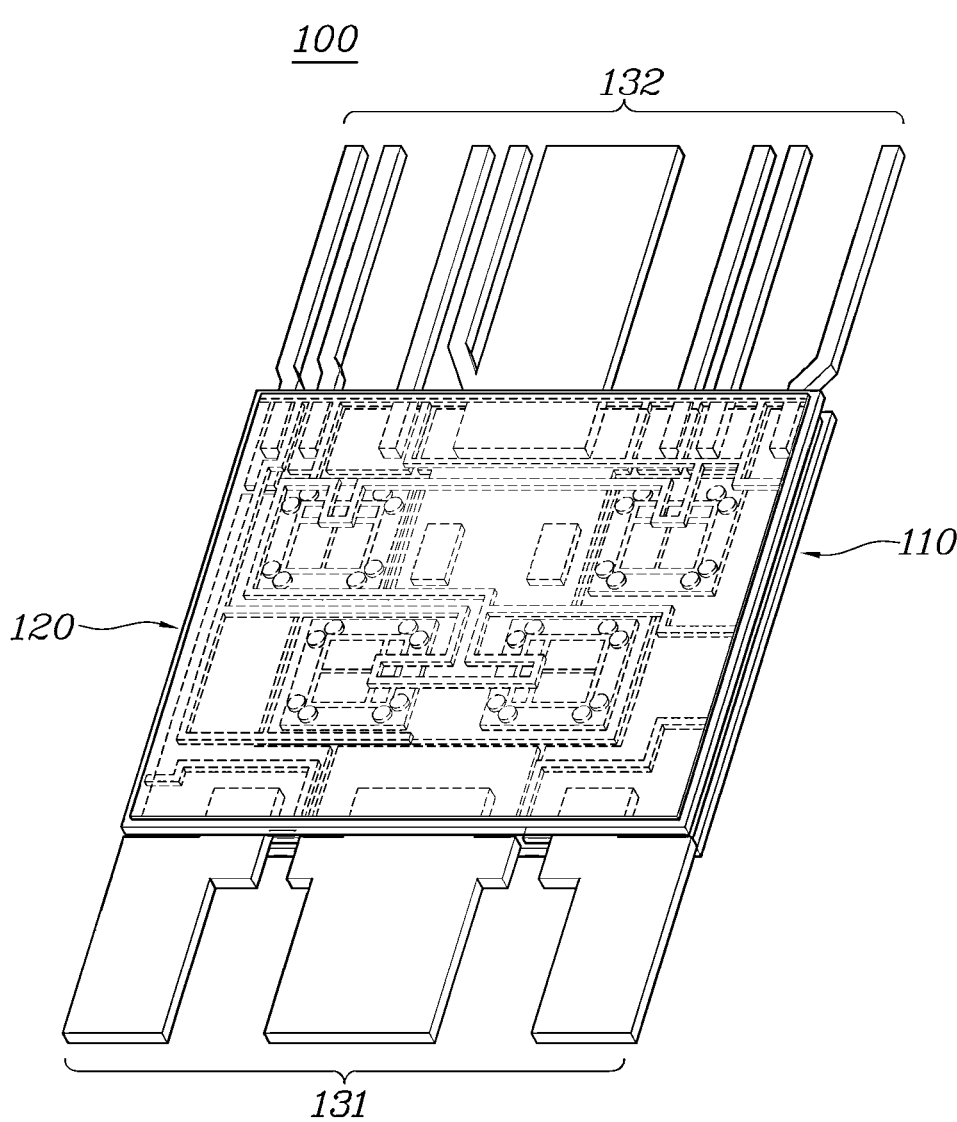
FIG. 4 is a perspective view of a power module for a vehicle according to an exemplary embodiment of the present disclosure.
Figure 5:
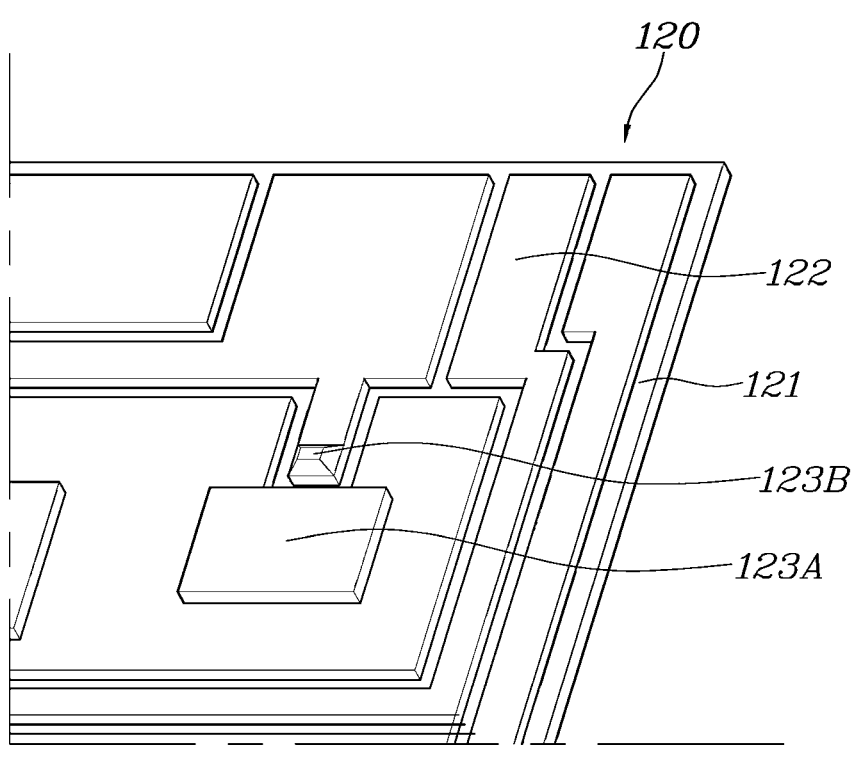
FIG. 5 is an enlarged perspective view of 'A' in FIG. 3.
Figure 6:
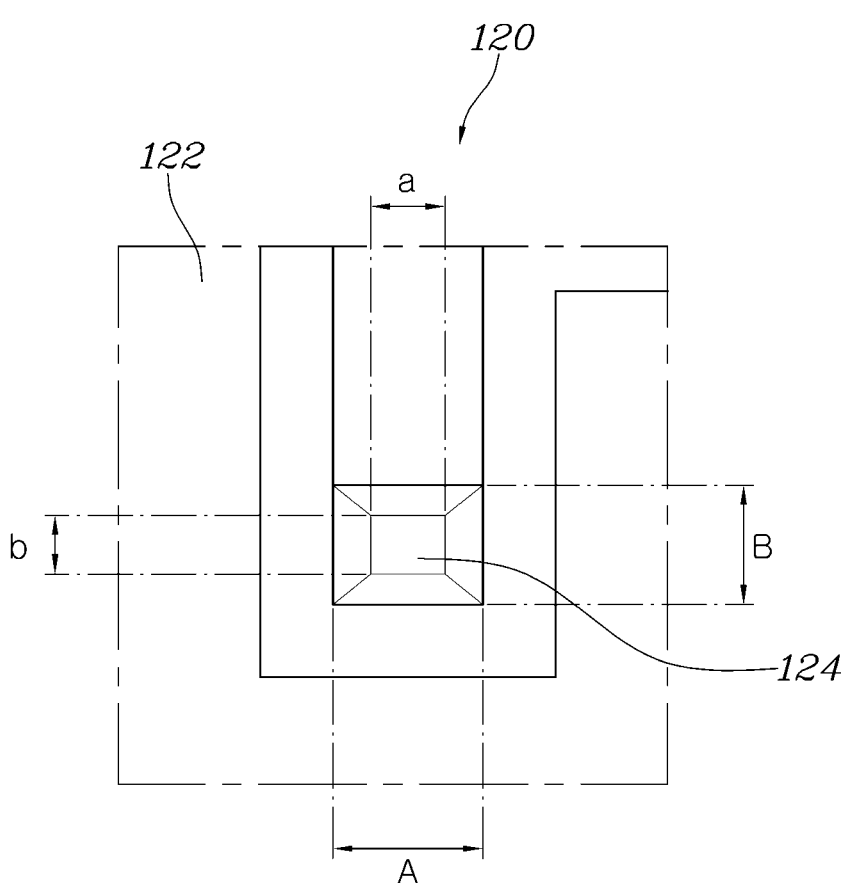
FIG. 6 is a front view of a 2-2nd spacer provided in a power module for a vehicle according to an exemplary embodiment of the present disclosure.

FIG. 1 is a cross-sectional view of a power module 100 for a vehicle according to an exemplary embodiment of the present disclosure, FIG. 2 is a perspective view of a first substrate 110 provided in the power module 100 for a vehicle according to an exemplary embodiment of the present disclosure, FIG. 3 is a perspective view of a second substrate 120 provided in the power module 100 for a vehicle according to an exemplary embodiment of the present disclosure, FIG. 4 is a perspective view of the power module 100 for a vehicle according to an exemplary embodiment of the present disclosure, FIG. 5 is an enlarged perspective view of 'A' in FIG. 3, and FIG. 6 is a front view of a 2-2nd spacer 123B provided in the power module 100 for a vehicle according to an exemplary embodiment of the present disclosure.

Embodiments of the power module 100 for the vehicle according to an exemplary embodiment of the present disclosure will be described with reference to FIGS. 1 to 6.

The power module 100 for the vehicle according to an exemplary embodiment of the present disclosure includes a first substrate 110, a second substrate 120 spaced from the first substrate 110 in a vertical direction and facing the first substrate 110, a semiconductor chip 140 disposed between the first substrate 110 and the second substrate 120 and including a power pad 141 and a signal 142, and a signal lead 131 and a power lead 132 disposed between the first substrate 110 and the second substrate 120.

As shown in FIG. 1 and FIG. 2, the first substrate 110 may include a first insulating layer 111 having a first surface S1-1 and a second surface S1-2, a first cooling layer 114 disposed beneath the first insulating layer 111, a first metal circuit 112 disposed on a first surface S1-1 of the first insulating layer 111, and a first spacer 113 extending upwards from the first metal circuit 112 and formed integrally with the first metal circuit 112.

The first insulating layer 111 generally includes a polymer resin and has a plate shape. The first cooling layer 114 is in contact with a cooling channel on the bottom thereof and functions to transfer heat generated from the inside of the double-sided cooling power module 100 to the cooling channel. The first metal circuit 112 refers to an electric path which is generally made of copper or the like conductor having high electrical conductivity, is formed on a 1-1st surface S1-1 of the first insulating layer 111, and allows an electric current to flow as connected to the power lead 132. The semiconductor chip 140 may be electrically connected to the first metal circuit 112.

The first spacer 113 is formed extending upwards from the first metal circuit 112 made of copper so that the first spacer 113 and the first metal circuit 112 may be formed as a single body, allowing current flowing from the power lead 132 to the first metal circuit 112 to flow to the first spacer 113.

As shown in FIG. 1, FIG. 2, and FIG. 3, the second substrate 120 may have a structure similar to that of the first substrate 110. The second substrate 120 may include a second insulating layer 121, a second cooling layer 124 formed on a second surface S2-2 of the second insulating layer 121, a second metal circuit 122 disposed beneath the second insulating layer 121, and a second spacer 123 extending downwards from the second metal circuit 122 and formed integrally with the second metal circuit 122.

Like the first insulating layer 111, the second insulating layer 121 generally includes a polymer resin and has a plate shape. Like the first cooling layer 114, the second cooling layer 124 is in contact with a cooling channel on the top portion thereof and functions to transfer heat generated from the inside of the double-sided cooling power module 100 to the cooling channel. The second metal circuit 122 refers to an electric path which is generally made of copper or the like conductor having high electrical conductivity, and is formed on a 2-1st surface S2-1 of the second insulating layer 121.

As shown in FIG. 1, FIG. 2, FIG. 3, and FIG. 4, the first substrate 110 is disposed at a lower side, the second substrate 120 is disposed at an upper side, and the first metal circuit 112 and the second metal circuit 122 are assembled to face each other. Between the first substrate 110 and the second substrate 120, there may be disposed in the semiconductor chip 140, the signal lead 131, and the power lead 132.

As shown in FIG. 1, the first spacer 113 extending from the first substrate 110 toward the second substrate 120 and a 2-3rd spacer 123C extending from the second substrate 120 toward the first substrate 110 may be connected to each other to form a via spacer 160.

The first spacer 113 and the 2-3rd spacer 123C are connected to each other so that the first metal circuit 112 and the second metal circuit 122 can electrically conduct with each other. Through the power lead 132 connected to at least one of the first metal circuit 112 and the second metal circuit 122, current flows in the corresponding metal circuit.

With the present structure, the first spacer 113 and a second spacer 123C are connected forming the via spacer 160, and therefore there is no need to form the conventional separate via spacer, reducing manufacturing costs.

Furthermore, when the first substrate and the second substrate are connected by the conventional separate via spacer, opposite longitudinal end portions of the via space are individually subjected to soldering or the like bonding process. On the other hand, according to an exemplary embodiment of the present disclosure, the first spacer 113 and the second spacer are connected by soldering 150 formed in one bonding process, simplifying the manufacturing process and reducing the manufacturing costs.

Furthermore, the conventional separate via spacer may be tilted while the liquid soldering is solidified during the bonding process for the conventional separate via spacer. On the other hand, according to an exemplary embodiment of the present disclosure, the first spacer 113 and the second spacer 123C are formed integrally with the circuit substrates, respectively, preventing the via spacer 160 from being tilted.

As shown in FIGS. 1 and 5, the second spacer 123 may be formed extending downwards from the second metal circuit 122, and may include a 2-1st spacer 123A connected to the power pad 141 of the semiconductor chip 140, and a 2-2nd spacer 123B connected to the signal pad 142.

The first metal circuit 112 and the second metal circuit 122 may be electrically connected to each other by the via spacer 160, and the 2-1st spacer 123A connected to the second metal circuit 122 and may be connected to the power pad 141 of the semiconductor chip 140.

As the signal lead 131 is electrically connected to one side of the second metal circuit 122, and the 2-2nd spacer 123B extending integrally from the second metal circuit 122 is connected to the signal pad 142 of the semiconductor chip 140, the control signal may be received from the outside thereof through the signal lead 131. Therefore, the second metal circuit 122 and the 2-2nd spacer 123B may be used in transmitting the control signal to the semiconductor chip 140.

With the present structure, the conventional wire bonding process for connecting the signal lead and the signal pad of the semiconductor chip is not carried out, thereby reducing process costs.

As the 2-2nd spacer 123B replaces the conventional wire bonding, it is possible to decrease the space needed for the wire bonding between the first substrate 110 and the second substrate 120. Therefore, the height of the via spacer 160 formed by connecting the first spacer 113 and the second spacer 123C is decreased, shortening a heat transfer path and improving heat dissipation performance.

Figure 7:
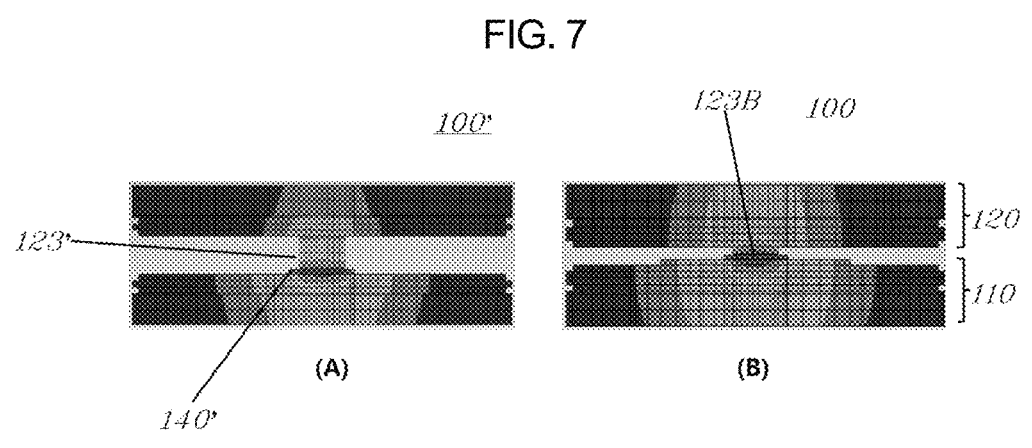

FIG. 7 is a cross-sectional view showing thermal variation in a power module 100' for a vehicle according to a comparative example and thermal variation in the power module 100 according to an exemplary embodiment of the present disclosure. In FIG. 7, the left view shows thermal distribution of the power module 100' for a vehicle according to the comparative example, and the right view shows thermal distribution of the power module 100 for a vehicle according to an exemplary embodiment of the present disclosure. Here, the power module 100' for a vehicle according to the comparative example employs a conventional separate spacer 123', and has a longer distance between the substances than that according to an exemplary embodiment of the present disclosure. As shown in FIG. 7, the comparative example shows that heat is concentrated around a semiconductor chip 140,' but the exemplary embodiment shows that heat is relatively uniformly distributed due to a shortened distance between the first substrate 110 and the second substrate 120 and thus the heat dissipation performance is improved.

As shown in FIG. 1 and FIG. 5 and FIG. 6, the cross-sectional area of the 2-2nd spacer 123B may be gradually decreased in a direction extending from the metal circuit.

The signal pad 142 formed in the semiconductor chip 140 and receiving the control signal is generally smaller than the power pad 141 to or from which current flows through the power lead 132.

In consideration of connecting the end portion of the 2-1st spacer 123A to such a small signal pad 142, the 2-2nd spacer 123B may taper to have a gradually decreasing cross-sectional area in the direction extending from the second metal circuit 122. In other words, the cross-sectional area of the 2-2nd spacer 123B at the end portion in the extending direction may be smaller than that at the side of the second metal circuit 122. The such end portion is in contact with the signal pad 142 of the semiconductor chip 140 and electrically connected to the semiconductor chip 140. With the present structure, the control signal input to the signal lead 131 is received in the semiconductor chip 140 through the second metal circuit 122 and the 2-2nd spacer 123B.

For example, the cross-section area at the end portion of the 2-2nd spacer 123B in the extending direction may be smaller by at least 30% than that at the side of the second metal circuit 122.

The cross-sectional area of the 2-2nd spacer 123B at the side of the second metal circuit 122 may be generally formed corresponding to the line width of the second metal circuit 122. On the other hand, if the cross-sectional area of the 2-2nd spacer 123B at the end portion in the extending direction is formed corresponding to the line width of the second metal circuit 122, the end portion of the 2-2nd spacer 123B may stick out of the signal pad 142 when bonded to the signal pad 142.

Accordingly, the end portion of the 2-2nd spacer 123B is formed to have a smaller cross-sectional area than that at the side of the second metal circuit 122, preventing the 2-2nd spacer 123B from separating from the signal pad 142 when bonded to the signal pad 142.

To shape the 2-2nd spacer 123B to have a cross-sectional area that becomes gradually smaller in its lengthwise direction, the 2-2nd spacer 123B may be shaped like a truncated cone or a truncated polygonal pyramid. For example, as shown in FIG. 5 and FIG. 6, the 2-2nd spacer 123B according to an exemplary embodiment of the present disclosure is shaped like a truncated square pyramid.

As shown in FIG. 6, the cross-sectional area of the 2-2nd spacer 123B shaped like the truncated square pyramid may be set to have a length of 'A' in a first direction and a length of 'B' in a second direction perpendicular to the first direction at the side of the second metal circuit 122, and may be set to have a length of 'a' in the first direction and a length of 'b' in the second direction at the end portion thereof. To make the cross-sectional area of the 2-2nd spacer 123B at the end portion be smaller by 30% or more than that at the side of the second metal circuit 122, the length of 'a' may be set to be shorter by 30% or more than the length of 'A' and the length of 'b' may be set to be shorter by 30% or more than the length of 'B.'

For example, the cross-sectional area of the 2-2nd spacer 123B at the end portion may be smaller by 50% than that at the side of the second metal circuit 122.

However, such a tapering percentage is merely an example, and not limited to the present example.

The first spacer 113 and the second spacer 123 may contain glass frit in their internal portions except their end portions.

The glass frit refers to an additive added for bonding metal to ceramic at a low temperature and forms physical/chemical bonding as a material having glass phase penetrates into the ceramic. The glass frit mainly contains SiO2, and pure SiO2 has a coefficient of thermal expansion (CTE) of 8.1 ppm, which is considerably lower than that of metal.

When the first spacer 113 and the second spacer 123 are stacked, the present stacked structure is configured to relieve the stress caused by the thermal expansion of the glass frit contained in the metal layer. Thus, the present stacked structure is applicable to the first spacer 113 and the second spacer 123 between which Coefficients of Thermal Expansion (CTE) mismatch is required to be considered.

On the other hand, the end portions of the first spacer 113 and the second spacer 123 in the extending direction (for example, the upper portion of the first spacer 113 or the lower portion of the second spacer 123) may be in contact with the semiconductor chip 140 or subjected to the soldering 150 or the like bonding material. Therefore, the end portions do not contain the glass frit in consideration of the electric bonding based on the bonding material.

The first spacer 113 and the second spacer 123 may be extended by printing and curing a conductive paste through a screen or by curing a conductive molten material.

Figure 8:
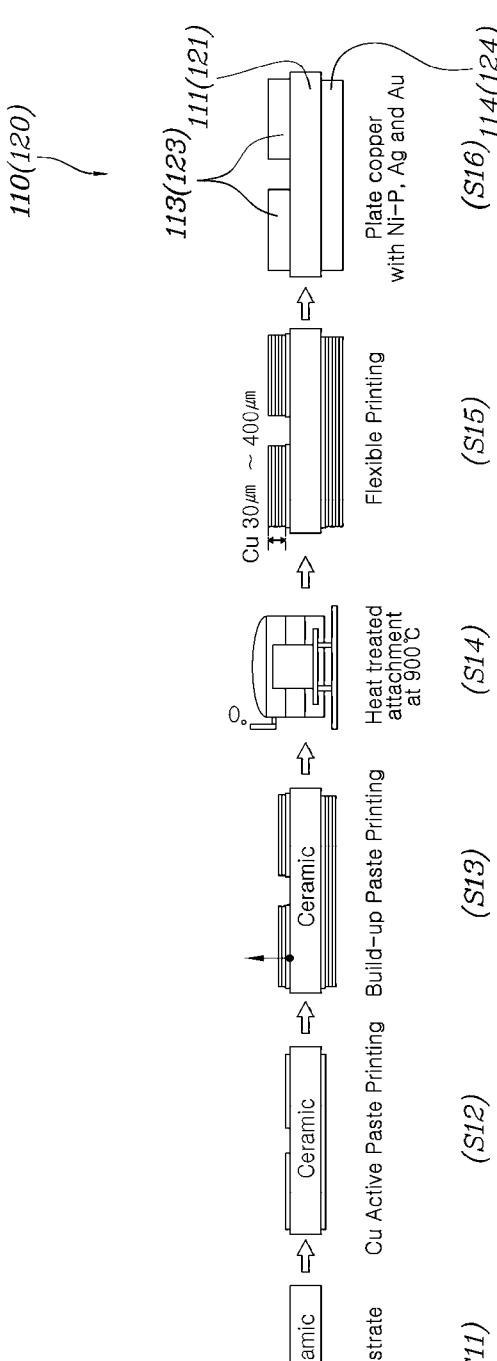
FIG. 8 is a view showing a manufacturing process of a power module for a vehicle based on a conductive paste printed through a screen.

FIG. 8 is a view showing a manufacturing process of the power module 100 for a vehicle based on a conductive paste printed through a screen.

As shown in FIG. 8, to extend the first spacer 113 or the second spacer 123 from the first metal circuit 112 or the second metal circuit 122, the insulating layer is prepared (S11), and the metal layer is printed to form the metal circuit (S12). After the process S12 of forming the metal circuit, a conductive paste is printed through a screen (S13) and then thermally cured (S14). The printing process S13 and the thermal curing process S14 are repeated to form the first spacer 113 or the second spacer 123 (S15). Accordingly, the metal circuit is plated with nickel-phosphorus alloy, silver, gold, etc. (S16), forming the first substrate 110 or the second substrate 120.

In the case where the first spacer 113 and the second spacer 123 are formed by the screen printing, the edge portions of the paste being in contact with the screen may be stretched in the direction of releasing the screen due to the viscosity of the paste in a screen releasing process in which the screen is removed from the printed paste. The deformed portions of the stretched paste may be post-processed by a pressing process or a grinding process. Below, the screen releasing process and the post-processing procedure will be described with reference to FIG. 9.

Figure 9:
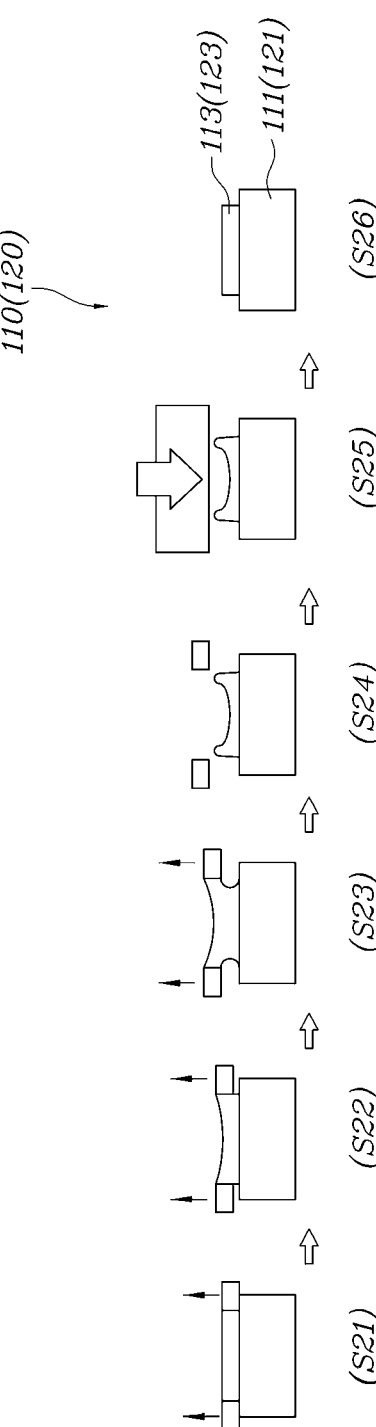
FIG. 9 is a view showing a screen releasing process and a post-processing procedure.

FIG. 9 is a view showing the screen releasing process and the post-processing procedure.

As shown in FIG. 9, the deformed portions (DE) formed as the conductive paste is stretched in the screen releasing process may be removed by pressing, grinding, etc. Here, the deformed portions (DE) have a cross-sectional shape in which the edge portions are raised, and thus will be called a 'dog ear.'

Referring to FIG. 9, the conductive paste is printed by seating the screen on the substrate, in which the screen is formed with a pattern corresponding to the desired shape of the metal layer (S21), and the screen is then released from the substrate (S22 and S22). In the instant case, the conductive paste in contact with the screen is stretched forming the dog ear (DE) as the screen is released from the substrate (S24), and thus a process of removing the dog ear (DE) is performed (S25). The process S25 of removing the dog ear (DE) may include the pressing process or the grinding process. When the dog ear (DE) is removed, the metal layer has a flat surface patterned corresponding to the pattern (S26).

By repeating the processes S21 to S26, the spacer is precisely provided having a thickness desired as requested by a designer.

Besides the screen printing, 3D printing that forms a structure by curing a conductive molten material may be used to prepare the spacer 113 or 123. When 3D printing is used to prepare the spacer 113 or 123, the spacer 113 or 123 has a thickness requested by a designer at once, having the advantage that manufacturing time is shortened.

Referring to FIG. 8 and FIG. 9, a method of manufacturing a power module according to an exemplary embodiment of the present disclosure will be described.

The method of manufacturing the power module according to an exemplary embodiment of the present disclosure may include the steps of forming a metal circuit on a first surface of an insulating layer (S11); and forming a plurality of spacers extending in a first direction on the metal circuit (S12). Step S12 of forming the plurality of spacers may include the steps of printing a conductive paste (S13); and thermally curing the printed conductive paste (S14). The printing step S13 and the thermal curing step S14 may be repeated a plurality of times.

Referring further to FIG. 9, the printing step S13 may include the steps of seating a screen formed with a pattern; applying a conductive paste to the pattern; releasing the screen (S22, S23, and S24); and removing a deformed portion of the applied conductive paste stretched as the screen is released (S25).

After the step S25 of removing the deformed portion, the conductive paste may be completely patterned (S26).

Furthermore, the method of manufacturing the power module according to an exemplary embodiment of the present disclosure may include a step of forming a cooling layer on a second surface of the insulating layer opposite to the first surface (S15).

The method of manufacturing the power module according to an exemplary embodiment of the present disclosure may further include plating the metal circuit and the plurality of spacers (S16).

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A power module for a vehicle, the power module comprising:
   a first substrate including a first metal circuit disposed on a first surface of the first substrate, and a first spacer extending from the first metal circuit in a first direction;
   a second substrate spaced from and facing the first substrate in a second direction, and including a second metal circuit disposed on a first surface of the second substrate facing the first surface of the first substrate, and a second spacer extending from the second metal circuit in the second direction; and
   a semiconductor chip disposed between the first substrate and the second substrate and including a power pad and a signal pad,
   wherein the first spacer and the second spacer are extended toward each other, and
   wherein the second spacer includes a second-1st spacer connected to the power pad and a second-2nd spacer connected to the signal pad, and
   wherein the first spacer and the second spacer contain glass frit in internal portions thereof except end portions thereof.

2. The power module of claim 1, further including:
   a signal lead disposed between the first metal circuit and the second metal circuit,
   wherein the signal lead is electrically connected to the signal pad via the second metal circuit and the second-2nd spacer.

3. The power module of claim 1, wherein the second-2nd spacer has a cross-sectional area that becomes smaller in a direction extending from the second metal circuit.

4. The power module of claim 3, wherein the cross-sectional area of the second-2nd spacer at an end portion in a direction extending from the second metal circuit is smaller by a preset percentage than a cross-sectional area at a side of the second metal circuit.

5. The power module of claim 4, wherein the preset percentage is greater than or equal to 30%.

6. The power module of claim 3, wherein the second-2nd spacer is in a shape of a truncated cone or a truncated polygonal pyramid, the cross-sectional area of which becomes smaller in the direction extending from the second metal circuit.

7. The power module of claim 1, further including a cooling layer connected to a cooler and disposed on at least one of a second surface of the first substrate opposite to the first surface of the first substrate and a second surface of the second substrate opposite to the first surface of the second substrate.

8. The power module of claim 7,
   wherein the cooling layer comprises a cooling layer of the first substrate and a cooling layer of the second substrate, and
   wherein the first substrate includes a first insulating layer between the first metal circuit and the cooling layer of the first substrate and a second insulating layer between the second metal circuit and the cooling layer of the second substrate.

9. The power module of claim 1, further including a power lead disposed between the first metal circuit and the second metal circuit.

10. The power module of claim 9, wherein the power lead is connected to at least one of the first metal circuit and the second metal circuit.

11. The power module of claim 1, wherein the first spacer and the second spacer are respectively extended from the first metal circuit and the second metal circuit by printing and curing a conductive paste through a screen or by curing a conductive molten material.

12. The power module of claim 1, wherein the second spacer further includes a second-3rd spacer and the first spacer and the second-3rd spacer of the second spacer extend toward each other in a predetermined direction and are electrically connected to form a via spacer.

13. The power module of claim 12, wherein the first spacer and the second-3rd spacer are formed integrally with the first and second circuit substrates.

14. The power module of claim 13, wherein the first spacer and the second-3rd spacer of the second spacer are electrically connected to each other by soldering.

15. A method of manufacturing a power module, the method comprising:
   forming a metal circuit on a first surface of an insulating layer; and
   forming a plurality of spacers extending from the metal circuit in a predetermined direction,
   the forming of the plurality of spacers including:
   printing a conductive paste; and
   curing the printed conductive paste, and
   wherein the printing and the curing are repeated predetermined times,
   wherein the printing includes:
   seating a screen formed with a pattern;
   applying the conductive paste to the pattern;
   releasing the screen; and
   removing a deformed portion of the applied conductive paste stretched as the screen is released.

16. The method of claim 15, further including forming a cooling layer on a second surface opposite to the first surface of the insulating layer.

17. The method of claim 15, further including plating the metal circuit and the plurality of spacers.

\* \* \* \* \*